(12) United States Patent
Brennan et al.

(10) Patent No.: US 7,788,562 B2
(45) Date of Patent: Aug. 31, 2010

(54) PATTERN CONTROLLED, FULL SPEED ATE COMPARE CAPABILITY FOR DETERMINISTIC AND NON-DETERMINISTIC IC DATA

(75) Inventors: Thomas Joseph Brennan, Santa Clara, CA (US); David Harry Armstrong, Santa Clara, CA (US)

(73) Assignee: Advantest Corporation, Tokyo, Nerima-Ku (JP)

( * ) Notice: Subject to any disclaimer, the term of this patent is extended or adjusted under 35 U.S.C. 154(b) by 828 days.

(21) Appl. No.: 11/606,866

(22) Filed: Nov. 29, 2006

(65) Prior Publication Data

US 2008/0126899 A1 May 29, 2008

(51) Int. Cl.
*G01R 31/28* (2006.01)
(52) U.S. Cl. .................... 714/732; 714/735
(58) Field of Classification Search .......... 714/726, 714/727, 729, 732, 724, 735
See application file for complete search history.

(56) References Cited

U.S. PATENT DOCUMENTS

| | | | |
|---|---|---|---|
| 5,528,610 A * | 6/1996 | Edler et al. ........... | 714/727 |
| 6,990,423 B2 | 1/2006 | Brown et al. | |
| 7,370,254 B2 * | 5/2008 | Rajski et al. ........ | 714/726 |
| 7,376,873 B2 | 5/2008 | Vranken et al. | |
| 7,404,126 B2 * | 7/2008 | Jain et al. ........... | 714/726 |
| 2002/0069382 A1 | 6/2002 | Hayashi et al. | |
| 2004/0133831 A1 * | 7/2004 | Williams et al. ...... | 714/726 |
| 2004/0210798 A1 | 10/2004 | Higashi | |
| 2005/0240848 A1 * | 10/2005 | Cote et al. ........... | 714/726 |

FOREIGN PATENT DOCUMENTS

| | | |
|---|---|---|
| CN | 1856713 A | 11/2006 |
| JP | 2002-174662 A | 6/2002 |
| JP | 2006-518460 A | 8/2006 |
| JP | 2007-506962 A | 3/2007 |
| WO | WO-2004/072669 A1 | 8/2004 |
| WO | WO-2008/031378 A1 | 3/2008 |
| WO | WO-2008/069113 A1 | 6/2008 |

OTHER PUBLICATIONS

International Search Report mailed Mar. 4, 2008, for PCT Application No. PCT/JP2007/073127, one page.
Written Opinion mailed Mar. 4, 2008, for PCT Application No. PCT/JP2007/073127, five pages.

* cited by examiner

*Primary Examiner*—David Ton
(74) *Attorney, Agent, or Firm*—Morrison & Foerster LLP (57) ABSTRACT

Pattern controllable LFSRs or MISRs are disclosed that are able to mask indeterminate states while performing tests on DUT outputs. At appropriate times, the MISRs or the LFSRs will mask the data being input to the MISRs or the LFSRs so that indeterminate states are not received. This allows fast/complex ATE Rx memory to be replaced by slower and smaller MISR pattern memory. At the end of a test period, the LFSRs or MISRs generate signatures which are then compared to a set of possible valid signatures for non-deterministic data. A pass/fail result is produced. By masking indeterminate states, fewer valid signatures need to be stored. Masking of the MISRs or LFSRs may be based on the fact that indeterminate states and good data in a serial output data stream tend to occur in predictable patterns, or that good data may follow alignment characters. MISR or LFSR output signatures may also be employed to test individual pattern segments instead of the entire input test pattern. This expected DUT Rx data compression implementation works for one signature (deterministic) data as well.

29 Claims, 5 Drawing Sheets

PATTERN CONTROLLED, FULL SPEED ATE COMPARE CAPABILITY FOR DETERMINISTIC AND NON-DETERMINISTIC IC DATA

FIELD OF THE INVENTION

This invention relates to a test system for testing semiconductor devices such as Integrated Circuits (ICs), and more particularly in one embodiment, to the testing of High Speed Serial (HSS) outputs of a Device Under Test (DUT) using programmable/controllable Linear Feedback Shift Registers (LFSRs) and/or Multiple Input Shift (or Signature) Registers (MISRs) combined with traditional vector masking control.

BACKGROUND OF THE INVENTION

ICs continue to experience drastic improvements in device speed and density. Increases in IC speed have resulted in a new class of ICs with HSS inputs and outputs. These HSS inputs and outputs currently operate at speeds of about 622 Mbits/sec to about 2-6 Gbits/sec, and next generation HSS inputs and outputs may reach speeds of 10-13 Gbits/sec. There are at least two different types of interfaces requiring HSS inputs and outputs. One type of interface is for communications, where a HSS differential input/output pair is referred to as a "lane," and wherein a clock might be embedded in the signal. A second type of interface requiring HSS inputs and outputs is found in memory devices communicating with a processor through a HSS memory interface. These memory interfaces may include a forwarded clock that is sent separate from, but along with, the data being transmitted.

Increases in device density have enabled IC manufacturers to design a high degree of functionality into a single device. However, significant increases in device density have not been matched by corresponding significant increases in pin counts, due in part to the physical limitations of board-level design and manufacturability. Therefore, to fully utilize the increased functionality made possible by increased device densities, the limited output pins on a device may be shared by different functions within the IC. In other words, several functions may be selectively coupled to a single output port corresponding to a single output pin.

Because each function may be clocked by a separate clock having a frequency that is different from other clocks, and different from a clock that drives the output port, cycle slipping and therefore indeterminate output data may occur. In addition, indeterminate data in the form of out-of-order data may occur when more than one function attempts to access the single output port on the same clock edge, or the functions experience differing delays due to changes in environmental conditions, common in multi-core sharing of same interfaces.

Furthermore, multi-core processor, multi-clock domain digital and asynchronous Systems On a Chip (SOCs) with mixed signals including Radio Frequency (RF) signals are now being employed with Serializer/Deserializer (SerDes) interfaces. These HSS data paths can also generate out of order packets of output data (representing indeterminate data) in normal operation. Traditional ATE solutions address this problem by: 1) capturing the entire data stream and performing post processing, or 2) testing with multiple different pattern variations until one of the variations passes. In either case, the result is long test times.

Figure 1:
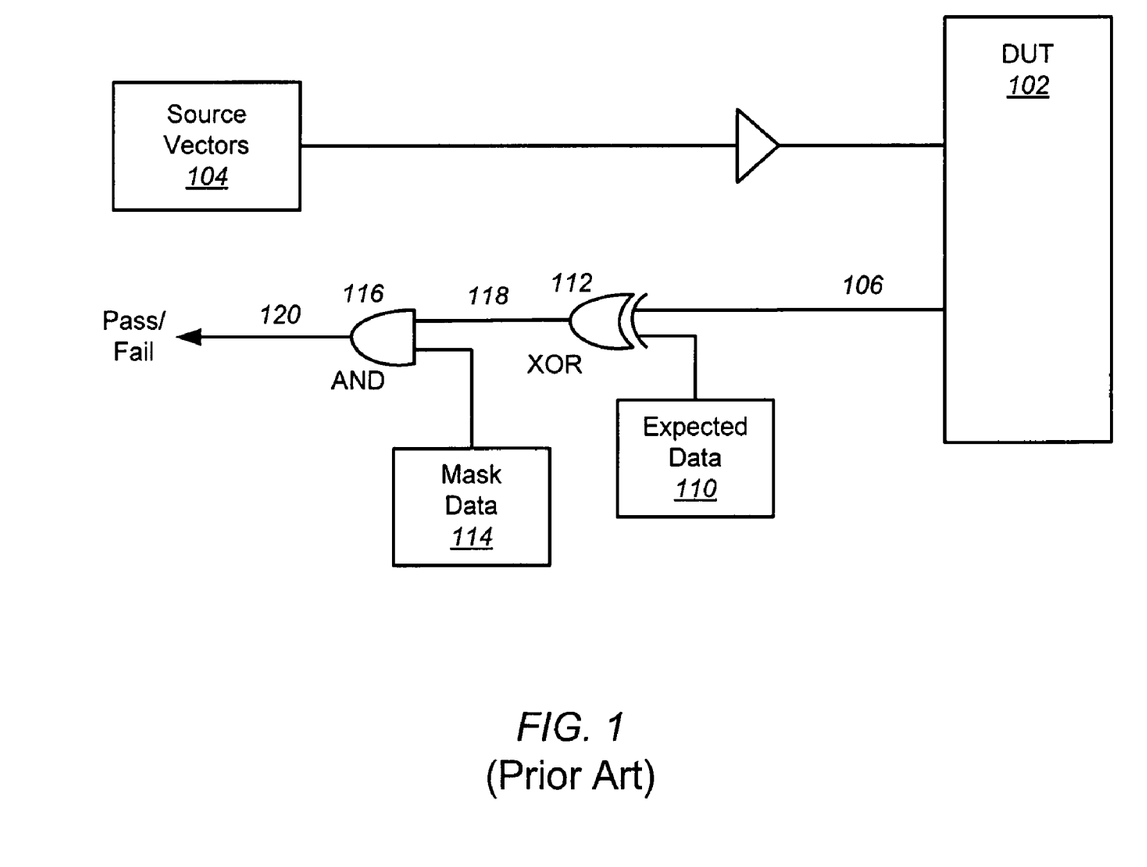
FIG. 1 symbolically illustrates an exemplary conventional ATE system for performing functional testing of HSS outputs.

Automatic Test Equipment (ATE) has been employed to test DUTs having HSS outputs by determining if the data being received from the DUT on a HSS output in response to a known input stimulus matches an expected output data sequence. FIG. 1 symbolically illustrates an exemplary conventional ATE system 100 for performing functional testing of HSS outputs. As shown in FIG. 1, to test a DUT 102, a serial stream of test patterns or source vectors 104 may be applied to the DUT, which then generates a serial output stream of data 106. This serial output data 106 is then digitally compared with expected data 110 in serial comparison logic symbolically shown as an eXclusive OR (XOR) gate 112, which produces a logic "1" on output 118 whenever a bit-by-bit comparison between the digital serial output data 106 and the expected serial data 110 does not yield a match.

As described above, both cycle slipping and out of order data can produce indeterminate output data. Moreover, the DUT 102 may be known to generate expected indeterminate serial output data states 106 at certain predictable times. To ignore these expected indeterminate states, output 118 can be further compared to serial mask data 114 in serial comparison logic symbolically illustrated as an AND gate 116, wherein the serial mask data is set to a logic "0" at the appropriate time to mask a known indeterminate data bit in the output by forcing a known state (a logic "0") on the output 120 regardless of the state of output 118. At all other times, the serial mask data 114 is a logic "1" to pass the result of comparison logic 112. Therefore, in the simplified illustration of FIG. 1, a steady stream of logic "0" states on output 120 indicates that a particular output data bit 106 has passed its test, while a logic "1" at any time indicates that the output data bit 106 has failed its test.

In the methodology of FIG. 1, because expected data 110 and mask data 114 must be maintained along with the source vector data 104, twice as much "receive" data (expected data and mask data) is needed as "drive" data (vector data), which is costly to store and utilize. Furthermore, additional expected data 110 and mask data 114 may be required to account for output data being encoded using different encoding schemes and changing Cyclic Redundancy Check (CRC) output codes. In addition, some DUT clock-embedded interfaces may be Alternating Current (AC) coupled, and thus the data packet sequence may be inverted to maintain Direct Current (DC) balance in an operation called "bit disparity." Traditional ATE solutions to this problem include: 1) capturing the entire data stream and performing post processing, which results in long test times, 2) Design For Test (DFT) methods of turning off bit disparity, which results in lower test coverage, 3) ignoring disparity bit changes, which greatly impacts test coverage, 4) careful pattern selection, which is extremely difficult to do, and 5) testing many different patterns until one passes. Complicating this situation even further is the fact that bit disparity is typically affected significantly by temperature and power supply levels.

To store all of this test data, very large ATE pattern memories are required, and attempts to access such large amounts of data at high speeds can greatly exceed memory access bandwidth. For example, as described above, conventional ATE uses a minimum of one bit per source vector and two bits per compare vector (one bit each for expected data and mask data). Because one HSS lane consists of a transmit and receive channel, one 10 Gbit/s lane requires 30 Gbit/s of data. Furthermore, a DUT may have 16 or more lane interfaces. For example, 16 10 Gbit/s lanes require 30 Gbit/s*16 or 480 Gbit/s of data. Conventional high end Dynamic Random Access Memory (DRAM) interfaces are 64-bit interfaces at 800 Mbit/s Double Data Rate (DDR2), or 51.2 Gbit/s. Therefore, full speed testing of 16 lane 10 Gbit/s HSS outputs requires 10 DDR DRAM interfaces, each with about 144 pins of address and data lines. This excessive pincount and bandwidth exceeds the capacity of conventional devices. The only cost-effective ATE solutions to this problem require breaking up the lanes into smaller groups. However, this adds to ATE cost, lowers channel density, and compromises lane-to-lane synchronization and transmit-to-receive asymmetric loopback production tests.

In order to avoid storing excessive amounts of data for functional testing, IC manufacturers have turned to the use of MISRs or LFSRs to perform their output data comparisons. The general term Signature Register (SR) will be used herein to describe either a MISR or LFSR. A MISR is an algorithmic routine implemented in digital logic, well-known to those skilled in the art, that tightly compresses parallel input data into a specific bit sequence (e.g. 32 bits). The parallel data may represent one serial data stream converted into parallel data (e.g. converted to 32 bits of parallel data at a time) by a SerDes, or a number of different serial channels, each channel providing one bit of data into the MISR. In any case, a MISR will generate a particular bit sequence or signature for every sequence of parallel input data, no matter how long. If any bit in the parallel input data is wrong or out of order, it will show up as a different MISR sum (i.e. a different bit sequence).

LFSRs perform the same function for serial bit streams. A LFSR is an algorithmic routine implemented in digital logic, well-known to those skilled in the art, that tightly compresses serial input data into a specific bit sequence (e.g. 32 bits). A LFSR will generate a particular bit sequence or signature for every sequence of serial input data, no matter how long. If any bit in the serial input data is wrong or out of order, it will show up as a different LFSR sum (i.e. a different bit sequence).

Some IC manufacturers have tried using SR techniques for Built-In Self Test (BIST) on Read Only Memory (ROM), Random Access Memory (RAM), and Pseudo-Random Bit Stream (PRBS) data. Some have also used SRs for functional test. Instead of using expected data and mask data, a SR is used to determine whether DUT output data passes or fails. In this approach, no long sequence of expected data and mask data needs to be stored for each test, eliminating roughly two thirds of the vector storage cost of the test. Instead, all that is needed is the source vectors and a list of acceptable signatures.

While IC manufacturers have used SR compare approaches to verify DUT outputs, such approaches have mainly been restricted to deterministic data such as Pseudo Random Bit Stream (PRBS) sequences, because conventional SRs cannot selectively mask or otherwise ignore the output data from the DUT at certain times to avoid indeterminate data. The only control available in these conventional systems is to completely turn off DUT output pins known to produce indeterminate states. As a result of this inability to selectively mask output data from the DUT at certain times, when a DUT generates indeterminate output states, those output states feed into the SR and corrupt the final pass/fail output signature. To accommodate these indeterminate states, a large number of possible good signatures must be stored and compared to the outputs of the SR to account for all of the possible expected indeterminate states and different acceptable output data streams. This also requires a great deal of simulation. As a result, ATE systems employing SRs have to take great care to reduce the number of indeterminate states and thereby reduce the number of possible valid signatures.

An example of an attempt to use a LFSR to generate signatures may be found in U.S. Pat. No. 6,990,423 by Brown et al. However, the LFSR described in this patent cannot be controlled to mask out indeterminate output data from the DUT, and thus suffers from the problems described above.

Therefore, there is a need to control SRs and turn them off or disable them at certain times to mask indeterminate states so that the indeterminate states do not corrupt their output signatures, and to reduce the amount of valid signature data that must be stored.

SUMMARY OF THE INVENTION

The present invention is directed to pattern controllable SRs that are able to mask indeterminate states while performing tests on DUT outputs. Under control of control logic, input test patterns for a particular test are applied to a DUT. The DUT may generate one or more HSS outputs or one or more lower speed serial outputs. Each of the HSS outputs and serial outputs are received into the test system. In the case of the HSS outputs, the HSS outputs may be converted to N bits of parallel data in de-serializers. At appropriate times, the control logic will send a mask signal to the SRs to mask the data being input to the SRs by forcing a known state into the SRs, and does so synchronously with the received serial output data so that indeterminate states are not fed into the SR. At the end of a test period, the SRs generate M-bit signatures. The signatures are then compared to a set of possible valid signatures stored in a signature library. A result is produced at the end of each comparison and may be forwarded to the control logic or elsewhere in the tester.

The control logic provides the masking capability lacking in conventional SRs used for functional test. By masking indeterminate states, fewer valid signatures need to be stored and compared to the output signature generated by the SR. Thus, in contrast to conventional methods in which expected data and mask data needs to be provided along with the source vectors, embodiments of the present invention only need source vectors, a list of possible valid signatures, and a way to mask the SR on the fly by forcing its inputs to a known state at the proper times.

Control of the SRs may be based on the fact that indeterminate states and good data in a serial output data stream tend to occur in predictable patterns. For example, in a simple embodiment, the SR could be controlled to follow a particular repeating pattern at some particular time after the test has begun. In another embodiment, the SR could be controlled to follow a particular repeating pattern after the control logic detects an alignment character in the serial output data stream of one of the DUT outputs. Alternatively, the control logic may wait a certain number of vectors or cycles after the start of a test before beginning to search for and detect the alignment character. In any case, after detecting the alignment character, the control logic may mask the SR in accordance with this repeating pattern of good and indeterminate data at the resolution provided by a mask control bit. A control memory may also be used to program the SRs and turn them on or off at the appropriate times, especially when the pattern of good and indeterminate data does not repeat.

As described above, after a complete test pattern has been input to the DUT, the output signature from the SR can be compared to a list of possible valid signatures. Note that the list of possible valid signatures accounts for certain expected sequences of out of order packets that are otherwise acceptable, and allows the SR to handle different acceptable signatures. Different acceptable signatures may occur if the data has some expected indeterminate states, if the data uses different encoding schemes, or if the data contains out of order packets in a variety of acceptable sequences.

Embodiments of the present invention allow SR output signatures to be employed to test individual pattern segments instead of the entire input test pattern. Control of the SRs as described above enables the test system to mask indeterminate states and test individual pattern segments. For example, to test a video interface using a video interface pattern segment, the SR may be initialized after the video interface pattern segment has begun to be applied to the DUT and an alignment character is detected in the serial output data. As the output data segment corresponding to the video interface pattern segment is received, the SR is controlled to mask any expected indeterminate states, either between pattern segments or even within pattern segments. After the output data segment has been fully received, the SR generates a signature that is compared to a set of possible valid signatures for that pattern segment. The SR may once again be initialized and masked or disabled until the next valid pattern segment is received. At the conclusion of this next pattern segment, the SR generates another signature that is compared to another set of possible valid signatures for that pattern segment. With signature analysis employed at pattern segment resolution, embodiments of the present invention enable to ATE to determine which parts or functions of the DUT worked properly, and which parts or functions did not.

The testing of individual pattern segments made possible by embodiments of the present invention also enables the entire test to be stopped if an unrecognized signature is detected (i.e. the output signature of a SR for a particular pattern segment does not match with any of the possible valid signatures for that pattern segment). This isolates the failure to a particular pattern segment, which may be useful in debugging the DUT or the test itself, and can improve test time when testing a failing device. Another alternative embodiment of the present invention is to compare, at periodic intervals within the serial output data corresponding to an entire test pattern or a pattern segment, the output signature of the SR to a list of possible valid signatures that may be expected at that time. These periodic comparisons are made even though the entire test pattern or pattern segment has not yet been input into the DUT. As long as the comparison is valid, the test continues. However, if the comparison fails, the test stops. This helps with design validation, and more particularly, error identification, because errors can be identified early, and the test cycle at which the error occurred can be narrowed to a range.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Instead of using significant amounts of very high bandwidth memory for doing at-speed compares, embodiments of the present invention utilize pattern controllable SRs that are able to mask indeterminate states while performing functional tests on DUT outputs. The control either forces a known state into the SR, or disables the SR at appropriate times and for an appropriate period of time, and may do so synchronously with the received DUT output data pattern so that indeterminate states are not fed into the SR.

Figure 2:
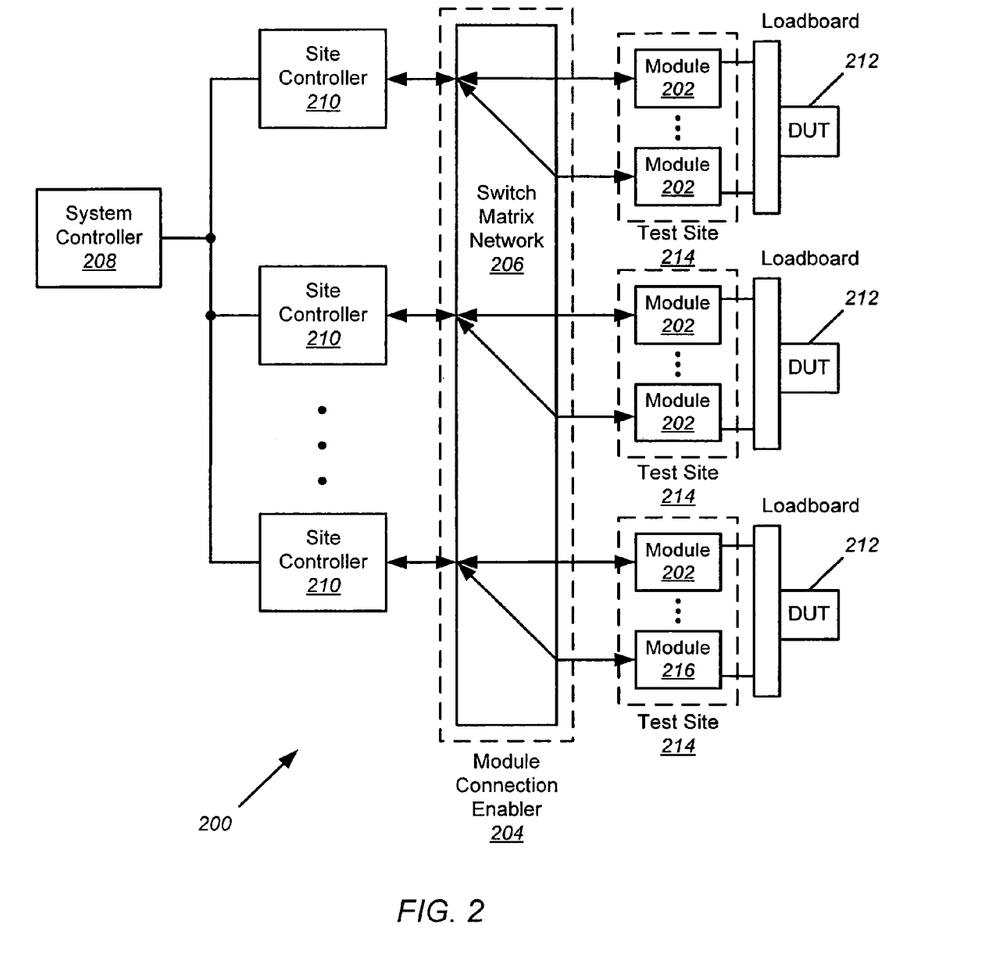
FIG. 2 is an illustration of an exemplary test system capable of incorporating embodiments of the present invention.

A high-level block diagram of an exemplary test system 200 capable of incorporating embodiments of the present invention is illustrated in FIG. 2. In FIG. 2, the modules 202 may be functional units such as an analog card, a Device Power Supply (DPS), Arbitrary Waveform Generator (AWG), a digitizer or a digital pincard 216 for performing functional testing on certain output pins according to embodiments of the present invention. The physical connections to the modules 202 and 216 may be obtained through a module connection enabler 204 that includes a switch matrix network 206. The switch matrix network 206 may include logic, traces, and pins. The system controller 208 is typically the point of interaction for a user. The system controller 208 provides a gateway to the site controllers 210 and synchronization of the site controllers 210 in a multi-site/multi-DUT environment. The system controller 208 and multiple site controllers 210 may operate in a master-slave configuration. The system controller 208 controls the overall system operation and determines that functions that a particular site controller 210 should perform. Each site controller 210 is itself sufficient to test a DUT 212. The site controller 210 controls and monitors the operation of various modules 202 and 216 within a test site 214. A test site 214 is a collection of modules that service the testing of a single DUT 212. A site controller 210 can control one or multiple test sites 214.

The overall platform consists of a hardware and software framework that provides interfaces through which various hardware and software modules can be employed. The architecture is a modularized system with module control software and a communication library that allows module-to-module, site controller to module, site controller-to-site controller, and system controller to site controller communication.

The digital pincard module 216 advantageously provides the test system 200 with a cost-effective and flexible capability to perform functional testing on DUT outputs using controllable SRs.

Figure 3:
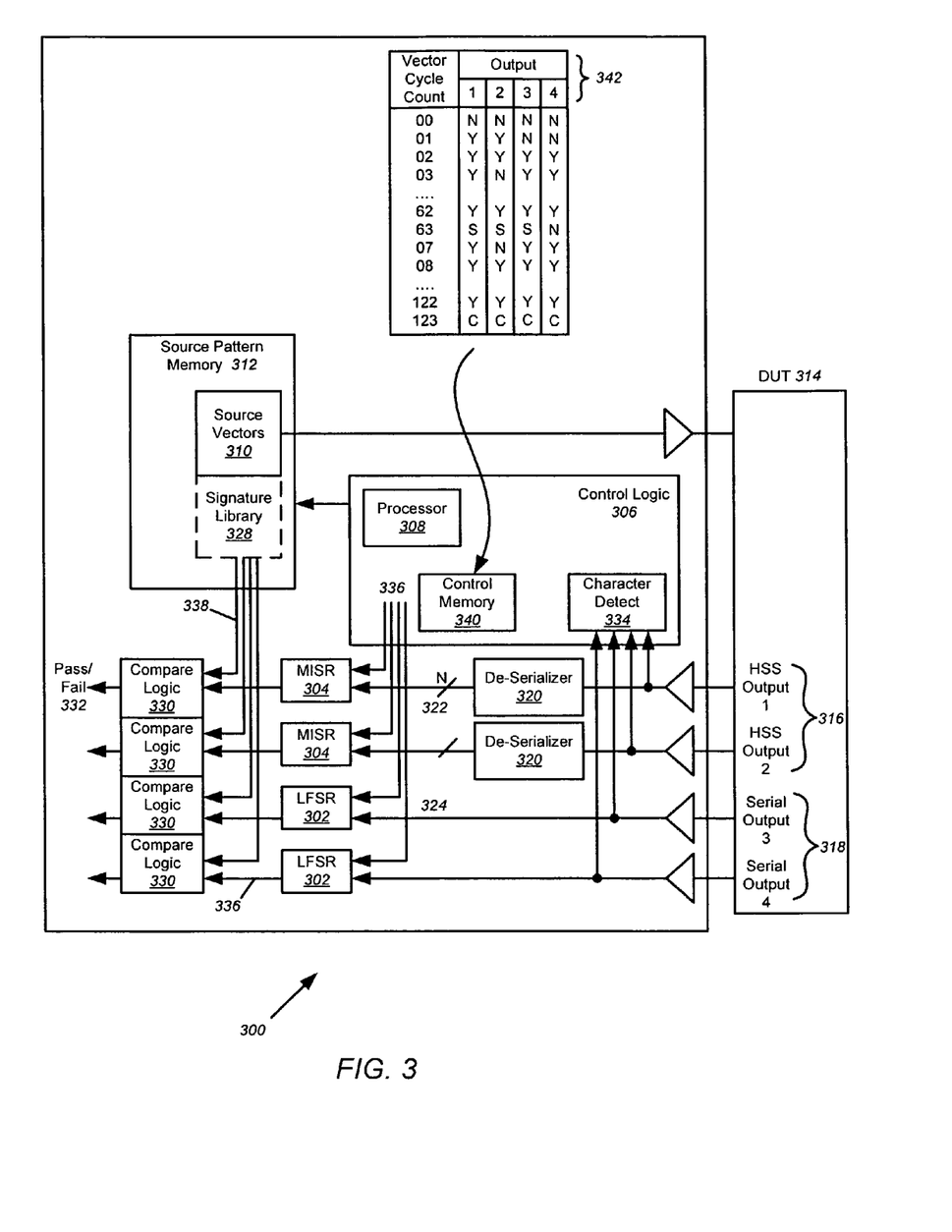
FIG. 3 illustrates a block diagram of an exemplary test system incorporating control of the SRs according to embodiments of the present invention.

FIG. 3 illustrates a block diagram of an exemplary test system 300 incorporating control of LFSRs 302 and/or MISRs 304 according to embodiments of the present invention. Under control of control logic 306, which may include one or more processors 308, source vectors or input test patterns 310 for a particular test stored in memory such as large-capacity source pattern memory 312 are applied to a DUT 314. Depending on the test being performed, the DUT may generate one or more HSS outputs 316 or one or more lower speed serial outputs 318. Each of the HSS outputs 316 and serial outputs 318 are received into the test system 300. In the case of the HSS outputs 316, the HSS outputs may be converted to N bits of parallel data in de-serializers 320.

At appropriate times (discussed in further detail below), the control logic 306 will send a mask signal 336 to the MISRs 304 or the LFSRs 302 to mask the data being input to the MISRs 304 or the LFSRs 302 by forcing a known state into the SRs, or by disabling the SRs, and does so synchronously with the received serial output data so that indeterminate states are not fed into the SR. It should be understood that the control logic 306 is designed or programmed in advance in accordance with the known input test patterns 310 and known indeterminate states, using techniques well-understood by those skilled in the art, to generate the mask signals 336 at the appropriate times. For example, in the case of the MISRs 304, instead of receiving the N-bit parallel data 322, the MISRs will receive a known state (e.g. N bits of parallel data set to all logic ones). In the case of the LFSRs 302, instead of receiving serial data 324, the LFSRs will receive a known state (e.g. a logic one). These forced known states will persist for a predetermined period of time according to the control logic. Forcing these known states into the MISRs 304 or LFSRs 302 may be accomplished by gating the inputs to the SRs using a OR gate or any other digital logic technique well-understood by those skilled in the art. Alternatively, the LFSRs 302 and MISRs 304 may be disabled such that no input data is clocked into the SRs.

The control logic 306 provides the masking capability lacking in conventional SRs used for functional test. Note that this masking does not involve bit by bit masking as done in conventional methods—rather, the simple forcing of known data or the disabling of the MISR 304 or LFSR 302 for a period of time determined by the pattern memory serves to mask groups of bits. By doing this, fewer valid signatures need to be stored and compared to the output signature generated by the LFSR 302 or MISR 304.

At the end of a test period (discussed in further detail below), the LFSRs 302 and MISRs 304 generate M-bit signatures 326, which may be in serial or parallel form. The signatures 326 are then compared to a set of possible valid signatures 338 stored in a signature library 328. The comparison takes place in compare logic 330. Note that the set of possible valid signatures 338 may vary depending on the DUT output. A result 332 is produced at the end of each comparison and may be forwarded to the control logic 306 or elsewhere in the tester.

Thus, in contrast to conventional methods in which expected data and mask data needs to be provided along with the source vectors, embodiments of the present invention only need source vectors 310, a list of possible valid signatures 328, and a way to "program" or control the LFSR 302 or MISR 304 on the fly by forcing a known state into it or disabling it (essentially turning it on or off) at the proper times via a much smaller compare pattern memory.

Figure 4:
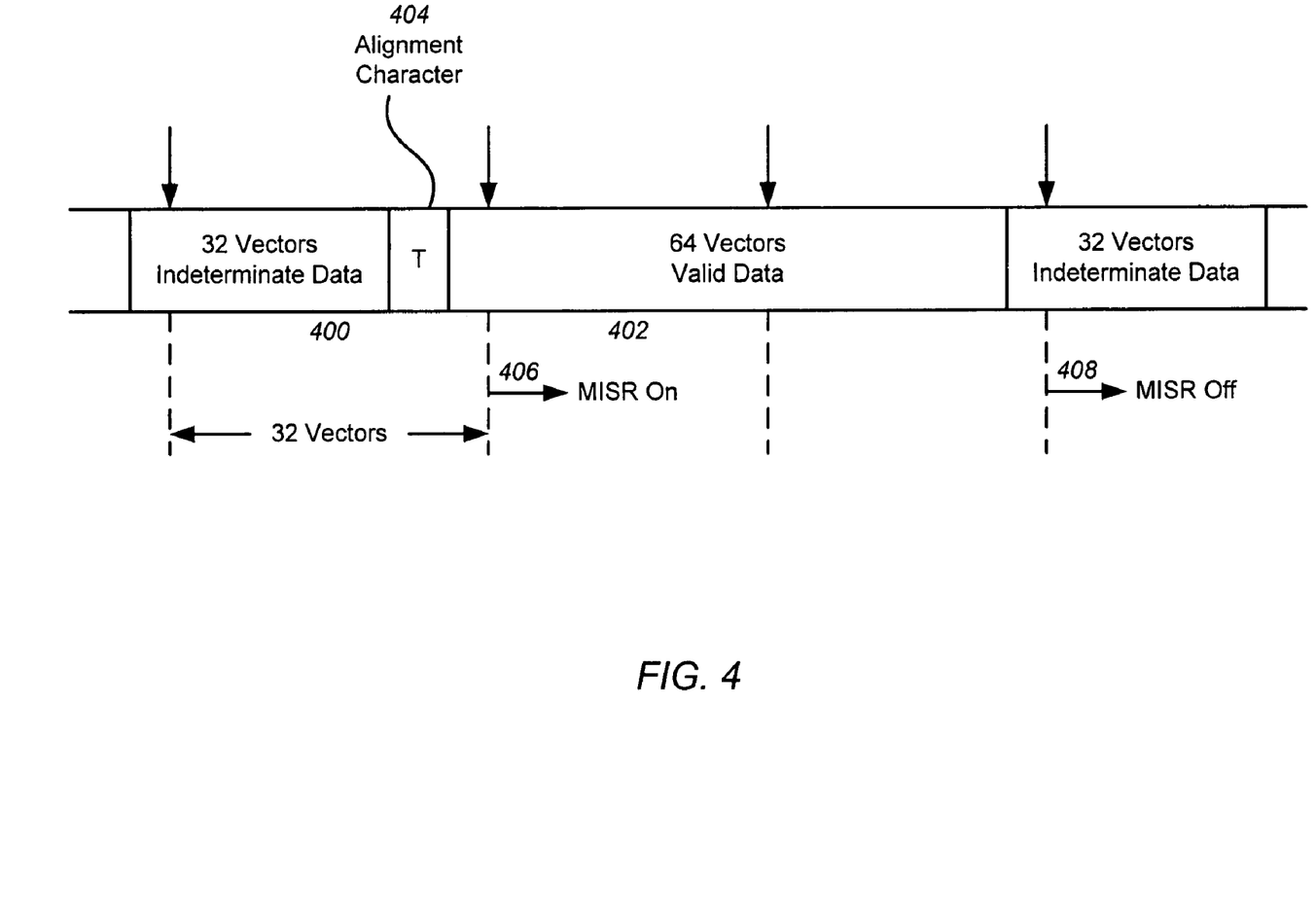
FIG. 4 illustrates a timing diagram showing a repeating pattern of indeterminate data, an alignment character "T" and good data, and the enabling of a SR after detection of the alignment character according to embodiments of the present invention.

As mentioned above, at appropriate times the control logic 306 will mask the data being input to the MISRs 304 or the LFSRs 302 by forcing a known state into the MISRs or LFSRs, or by disabling the SRs. This masking is performed synchronously with the received serial output data to limit the amount of indeterminate input data that is clocked into the SR. Control of the MISRs 304 or LFSRs 302 may be based on the fact that indeterminate states and good data in a serial output data stream tend to occur in predictable patterns. For example, as illustrated in the simple example of FIG. 4, indeterminate data 400 may occur for a number of consecutive vectors (e.g. 32 vectors) followed by a second number of consecutive vectors of good data 402 (e.g. 64 vectors), in a repeating pattern.

Referring again to FIG. 3, in a simple (but not necessarily the most effective) embodiment, the MISR 304 or LFSR 302 could be controlled to follow a particular repeating pattern at some particular time after the test has begun. A program or logic within the control logic 306 could be used to generate the control signals 336 to mask or unmask the MISR 304 or LFSR 302.

In another embodiment, the MISR 304 or LFSR 302 could be controlled to follow a particular repeating pattern after the control logic 306 detects an alignment character (e.g. the alignment character "T" 404 in FIG. 4) in the serial output data stream of one of the DUT outputs using character detection circuit 334. Alternatively, the control logic 306 may wait a certain number of vectors or cycles after the start of a test before beginning to search for and detect the alignment character. An alignment character could also be detected in the input test pattern being sent to the DUT. In any case, after detecting the alignment character, a program or logic within the control logic 306 may turn the MISR 304 or LFSR 302 on and off in accordance with this repeating pattern of good and indeterminate data at the resolution provided by the control bit 336. For example, if the control bit 336 can be toggled only once every 32 vectors, and 64 vectors of good data is known to be preceded by the alignment character "T" and followed by 32 vectors of indeterminate data, then the control logic 306 would be set up to enable the MISR 304 or LFSR 302 for the appropriate number of vectors (subject to the resolution of the control bit) at the first 32 vector interval after the detection of the "T" alignment character. Referring again to FIG. 4, after the detection of the alignment character "T" at 404, the MISR 304 or LFSR 302 can be turned on at 406, which is the first 32 vector interval after the detection of the "T" alignment character, and turned off at 408, 64 vectors later. The programming code for this embodiment may utilize a table with fields for cycle number (e.g. vector 455000), alignment character (e.g. T), length of valid data (e.g. 5000 vectors), and acceptable output signatures.

Referring again to FIG. 3, as an alternative to program control, logic or tables within the control logic 306, a control memory 340 may be used to program the LFSRs 302 or MISRs 304 and turn them on or off at the appropriate times. The control memory 340 may only need to provide a single bit 336 to each LFSR 302 or MISR 304 to force the input of the SR to a known state (or enable or disable the SR) every certain number of vectors or Unit Intervals (UIs).

A control memory 340 may be used even when the pattern of good and indeterminate data does not repeat. As shown in FIG. 3, the control memory 340 may also store a number of different non-repeating control patterns 342, one for each DUT output, each pattern having a "N" for mask and a "Y" for no mask at each vector cycle count. Note that the "S" in the patterns 342 denotes where a synchronization event occurs (looking for an alignment character), and the "C" denotes where a compare action is triggered (i.e. check the signature code against the codes in the library). In the example of FIG. 3, there are four control patterns 342, each corresponding to a DUT output, and for each vector cycle count, a "N" or "Y" is stored to represent whether the SR associated with each DUT output should be masked or not.

In the example of FIG. 3, every 32 vectors are either enabled for analysis or disabled. This cuts the memory and bandwidth required for comparison by a factor of 64, while still having significant programmability/flexibility. At the end of the pattern, the signature per pin is read and compared to several possibly valid signatures. It should be understood, however, that a different number of vectors (e.g. 256, 16, 1024, etc.) may be enabled or disabled for analysis, depending on different compression factors.

As described above, in any of the embodiments described above, after a complete test pattern of source vectors 310 has been input to the DUT 314, the output signature 326 from the LFSR 302 or MISR 304 can be compared using compare logic 330 to a list of possible valid signatures stored in signature memory 328. Note that the list of possible valid signatures accounts for certain expected sequences of out of order packets that are otherwise acceptable, and allows the LFSR 302 or MISR 304 to handle different acceptable signatures. Different acceptable signatures may occur if the data has some expected indeterminate states, if the data uses different encoding schemes, or if the data contains out of order packets in a variety of acceptable sequences. However, it should be understood that the control of LFSRs 302 and MISRs 304 of the present invention and the resultant masking of indeterminate states reduces the number of possible signatures and therefore the number of possibly valid signatures that must be stored in the signature library 328.

In traditional ATE testing, one or more pattern segments in the source vector input stream may be employed for testing different parts or functions of the DUT, such as a video interface, an audio interface, and the like. Each pattern segment is a separate section of the overall input test pattern, and successive pattern segments may even be separated by indeterminate states created as the ATE switches between tests.

Previous SR ATE solutions without control of the SR were only capable of applying the SR to the entire output data stream and generating one output data signature for the entire test pattern. Because indeterminate output states could not be masked, any indeterminate output states were fed into the SR along with the output data stream, resulting in a number of possible valid output signatures. Furthermore, because the SR could not be initialized, paused or disabled, all pattern segments in the test pattern had to be treated as part of a single test. The length of the single test meant that more indeterminate states were possible within that test, necessitating a very large signature library to store all of the possible valid output signatures from the SR.

Figure 5:
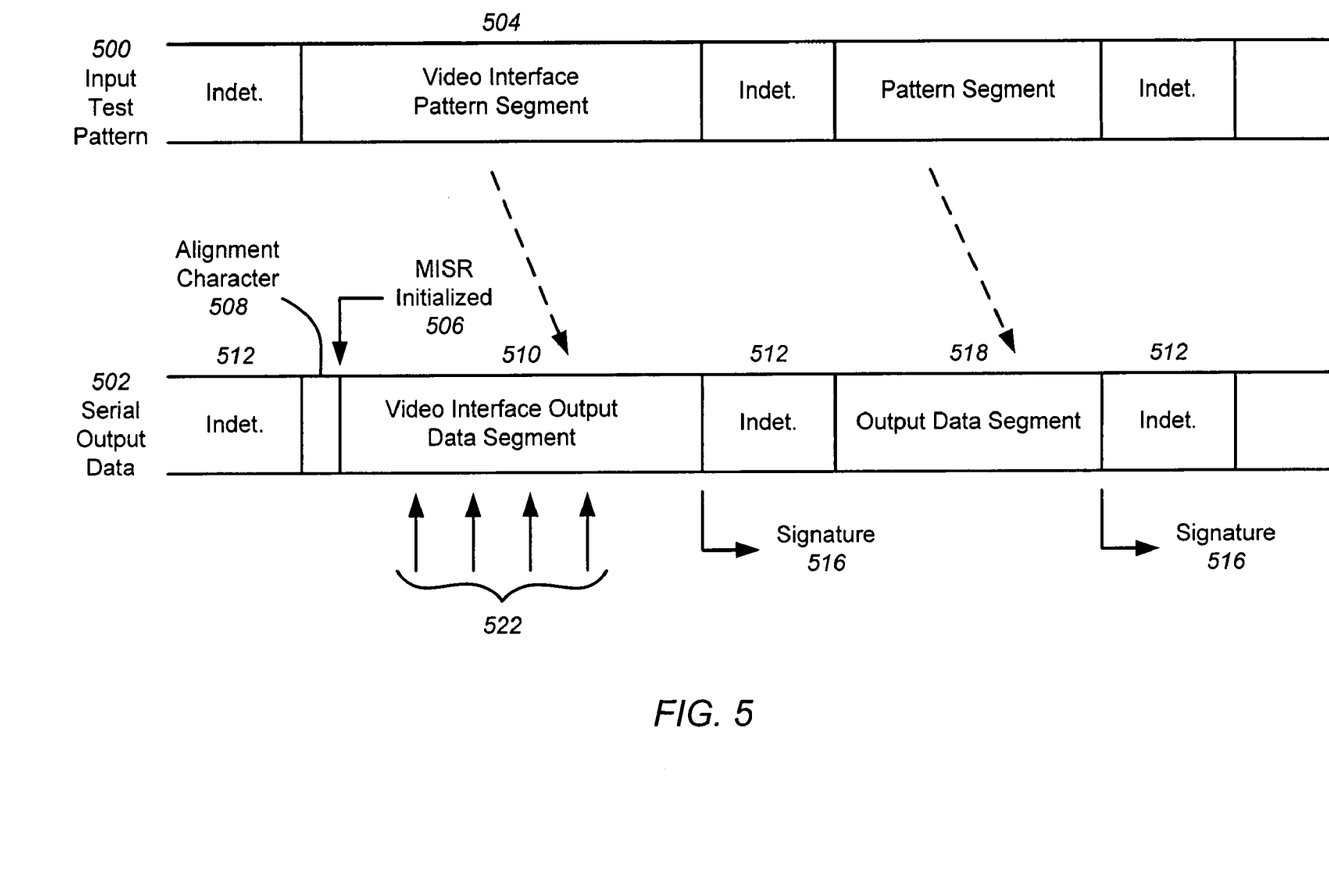
FIG. 5 illustrates a timing diagram of an input test pattern comprised of pattern segments and serial output data received from the DUT to be fed into a controllable SR according to embodiments of the present invention.

FIG. 5 illustrates a timing diagram of an input test pattern 500 generated from a test system. The test pattern is comprised of pattern segments, each pattern segment capable of testing a particular part or function of a DUT. The input test pattern 500 may also include indeterminate states between the pattern segments. FIG. 5 also illustrates serial output data 502 received from the DUT. The serial output data 502 is comprised of output data segments, each output data segment corresponding to a pattern segment in the input test pattern 500. The serial output data 502 may also include indeterminate states between output data segments or even within output data segments.

Embodiments of the present invention allow SR output signatures to be employed to test individual pattern segments instead of the entire input test pattern 500. Control of the SRs as described above enables the test system to mask indeterminate states and test individual pattern segments. For example, to test a video interface using the video interface pattern segment 504, the SR may be initialized at 506 after the video interface pattern segment 504 has begun to be applied to the DUT and an alignment character 508 is detected in the serial output data 502. As the output data segment 510 corresponding to the video interface pattern segment 504 is received, the SR is controlled using one of the embodiments described above to mask any expected indeterminate states, either between output data segments (see reference character 512) or even within output data segments. After the output data segment 510 has been fully received, the SR generates a pattern segment output signature at 516 that is compared to a set of possible valid signatures for that pattern segment. The SR may once again be initialized and masked or disabled until the next valid pattern segment is received at 518. At the conclusion of this next pattern segment 518, the SR generates another pattern segment output signature at 520 that is compared to another set of possible valid signatures for that pattern segment. With signature analysis employed at pattern segment resolution, embodiments of the present invention enable to ATE to determine which parts or functions of the DUT worked properly, and which parts or functions did not.

The testing of individual pattern segments made possible by embodiments of the present invention also enables the entire test to be stopped if an unrecognized signature is detected (i.e. the output signature of a SR for a particular pattern segment does not match with any of the possible valid signatures for that pattern segment). This isolates the failure to a particular pattern segment, which may be useful in debugging the DUT or the test itself, and can speed up the test time associated with testing bad devices. For example, if the pattern segment output signature at 516 in FIG. 5 did not match any of the possibly valid pattern segment output signatures for the video interface pattern segment 504, the test could be stopped at that time, isolating the failure to the video interface test.

Another alternative embodiment of the present invention is to compare, at periodic intervals (e.g. once every 1024 vectors or cycles) within the serial output data corresponding to an entire test pattern or a pattern segment, the output signature of the SR to a list of possible valid signatures that may be expected at that time. These periodic comparisons are made even though the entire test pattern or pattern segment has not yet been input into the DUT. As long as the comparison is valid, the test continues. However, if the comparison fails, the test stops. This helps with design validation, and more particularly, error identification, because errors can be identified early, and the test cycle at which the error occurred can be narrowed to a range. For example, periodic comparisons of the output signature generated at various points 522 within the output data segment 510 being generated in FIG. 5 can be made to determine where the video interface test is failing within the video interface pattern segment 504.

One limitation, even for embodiments of the present invention, is the number of acceptable SR signatures that must be compared to the output signatures generated by the SR. As illustrated in FIG. 3, one way to minimize the impact of these large numbers of acceptable signatures is to store them in a signature library 328 in a large-capacity source pattern memory 312 (the memory used to store the input test patterns) at the end of the same source vectors 310 that will generate one of the acceptable signatures, rather than in some expected SR code memory (a.k.a. "signature library"). Storing the acceptable signatures 328 in source memory 312 along with the input patterns or data streams 310 preserves the direct correlation between them and is a logical place to store them. Furthermore, it allows the control logic 306 to more easily link the two during the test.

In summary, the novel approach according to embodiments of the present invention uses ATE pattern control to mask SRs per serial output using traditional vector control. This overcomes the need for large ATE pattern compare memory and bandwidth, resulting in significant cost savings. Furthermore, this approach supports and scales to higher data rates with less hardware complexity. The programmability of the SRs allows embodiments of the present invention to test all types of functional data and replace traditional vectors. By using SR signatures, pattern download challenges are reduced and/or eliminated. In addition, by providing multiple possibly valid signatures, embodiments of the present invention also solves non-deterministic HSS output behavior problems. By using signatures over short segments of vectors, embodiments of the present invention can be easily optimized for a performance level within appropriate technology and price constraints. By using disabling SR based signature analysis over short segments of vectors, embodiments of the present invention can effectively mask or ignore appropriate portions of the pattern. By using signatures over short pattern segments, the solution still maintains a reasonable ability to identify the location of failures.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An apparatus for testing a Device Under Test (DUT), comprising:
   one or more Signature Registers (SRs), each SR for receiving a serial output from the DUT and generating an output signature for comparison to one or more possible valid output signatures for that serial output;
   one or more de-serializers coupled to the one or more SRs for converting one or more of the serial outputs from the DUT into parallel data; and
   control logic coupled to the one or more SRs for generating a control mask signal to control the masking of indeterminate data by the SRs,
   wherein the one or more SRs are controllable to mask, on the fly, indeterminate data received on the serial output and reduce the number of possible valid output signatures for its corresponding serial output, and
   wherein the control logic generates the control signal mask according to a repeating mask/unmask pattern after detecting an alignment character.

2. The apparatus as recited in claim 1, further comprising a control memory coupled to the control logic for storing and generating the control signal mask.

3. The apparatus as recited in claim 1, further comprising:
   a source pattern memory coupled to the control logic containing input test patterns to be sent to the DUT;
   wherein at least one input test pattern is comprised of one or more pattern segments for testing different parts or functions of the DUT; and
   wherein at least one SR receives one or more output data segments corresponding to the one or more pattern segments, and generates one or more pattern segment output signatures corresponding to the one or more pattern segments.

4. The apparatus as recited in claim 3, further comprising compare logic coupled to the one or more SRs for comparing the pattern segment output signatures from the one or more SRs to one or more possible valid pattern segment output signatures.

5. The apparatus as recited in claim 3, the compare logic coupled to the control logic and configured for stopping the testing of the DUT as soon as an error is detected in the control logic.

6. The apparatus as recited in claim 3, wherein at least one SR receives serial output data corresponding to an input test pattern, and compares the serial output data to stored output signatures at periodic intervals.

7. The apparatus as recited in claim 1, the one or more SRs further comprising an input gate for forcing a known state into the SRs when a control mask signal is received by the SR.

8. The apparatus as recited in claim 1, the one or more SRs further comprising a disable input for disabling the SRs when a control mask signal is received by the SRs.

9. The apparatus as recited in claim 1, the one or more SRs controllable to mask indeterminate data synchronously with the serial output received from the DUT.

10. The apparatus as recited in claim 1, further comprising compare logic coupled to the one or more SRs for comparing the output signatures from the one or more SRs to the one or more possible valid output signatures.

11. The apparatus as recited in claim 10, further comprising a signature library coupled to the compare logic for storing the one more possible valid output signatures.

12. The apparatus as recited in claim 11, wherein the signature library is stored in a source pattern memory.

13. The apparatus as recited in claim 1, wherein the apparatus forms part of a test site to enable the test site to test the serial outputs while reducing a number of possible valid output signatures that need to be stored.

14. The apparatus as recited in claim 13, wherein the test site forms part of a test system to enable the test system to test the serial outputs while reducing the number of possible valid output signatures that need to be stored.

15. A method for testing a Device Under Test (DUT), comprising:
   receiving each of one or more serial outputs from the DUT into separate Signature Registers (SRs);
   controlling the SRs to mask indeterminate data received on the one or more serial outputs and reduce a number of possible valid output signatures for each serial output;
   generating an output signature at the SRs for comparison to the one or more possible valid output signatures for each serial output;
   converting one or more of the serial outputs from the DUT into parallel data;
   generating a control mask signal to control the masking of indeterminate data by the SRs; and
   generating the control signal mask according to a repeating mask/unmask pattern after detecting an alignment character.

16. The method as recited in claim 15, further comprising utilizing a control memory for storing and generating the control signal mask.

17. The method as recited in claim 15, further comprising:
   storing input test patterns to be sent to the DUT in a source pattern memory, at least one input test pattern being comprised of one or more pattern segments for testing different parts or functions of the DUT; and
   receiving one or more output data segments corresponding to the one or more pattern segments into at least one SR, and generating one or more pattern segment output signatures corresponding to the one or more pattern segments.

18. The method as recited in claim 17, further comprising comparing the pattern segment output signatures from the one or more SRs to one or more possible valid pattern segment output signatures.

19. The method as recited in claim 17, further comprising stopping the testing of the DUT as soon as an error is detected.

20. The method as recited in claim 17, further comprising receiving serial output data corresponding to an input test pattern into at least one SR, and comparing the serial output data to stored output signatures at periodic intervals.

21. The method as recited in claim 15, further comprising for forcing a known state into the SRs when a control mask signal is received by the SR.

22. The method as recited in claim 15, further comprising disabling the SRs when a control mask signal is received by the SRs.

23. The method as recited in claim 15, further comprising controlling the one or more SRs to mask indeterminate data synchronously with the serial output received from the DUT.

24. The method as recited in claim 15, further comprising comparing the output signatures from the one or more SRs to the one or more possible valid output signatures.

25. The method as recited in claim 24, further comprising storing the one more possible valid output signatures in a signature library.

26. The method as recited in claim 25, further comprising storing the signature library in a source pattern memory.

27. The method as recited in claim 15, implemented within a test site to enable the test site to test the serial outputs while reducing a number of possible valid output signatures that need to be stored.

28. The method as recited in claim 27, further comprising employing the test site within a test system to enable the test system to test the serial outputs while reducing the number of possible valid output signatures that need to be stored.

29. An apparatus for testing a Device Under Test (DUT), comprising:
- means for receiving each of one or more serial outputs from the DUT into separate Signature Registers (SRs);
- means for controlling the SRs to mask indeterminate data received on the one or more serial outputs and reduce a number of possible valid output signatures for each serial output;
- means for generating an output signature at the SRs for comparison to the one or more possible valid output signatures for each serial output; and
- means for converting one or more of the serial outputs from the DUT into parallel data;
- means for generating a control mask signal to control the masking of indeterminate data by the SRs; and
- means for generating the control signal mask according to a repeating mask/unmask pattern after detecting an alignment character.

* * * * *